(12) United States Patent
Gasse et al.

(10) Patent No.: US 11,581,464 B2
(45) Date of Patent: Feb. 14, 2023

(54) PHOTO-EMITTING AND/OR PHOTO-RECEIVING DIODE ARRAY DEVICE

(71) Applicant: COMMISSARIAT A L'ENERGIE ATOMIQUE ET AUX ENERGIES ALTERNATIVES, Paris (FR)

(72) Inventors: Adrien Gasse, Grenoble (FR); Ludovic Dupre, Grenoble (FR); Marianne Consonni, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 153 days.

(21) Appl. No.: 17/221,344

(22) Filed: Apr. 2, 2021

(65) Prior Publication Data

US 2021/0313499 A1 Oct. 7, 2021

(30) Foreign Application Priority Data

Apr. 6, 2020 (FR) ....................................... 2003427

(51) Int. Cl.
*H01L 33/62* (2010.01)
*H01L 33/00* (2010.01)
(Continued)

(52) U.S. Cl.
CPC ............ *H01L 33/62* (2013.01); *H01L 25/167* (2013.01); *H01L 31/02005* (2013.01);
(Continued)

(58) Field of Classification Search
None
See application file for complete search history.

(56) References Cited

U.S. PATENT DOCUMENTS 10,204,950 B1 2/2019 Yamashita
11,094,742 B2 * 8/2021 Gasse ............ H01L 31/022408
(Continued)

FOREIGN PATENT DOCUMENTS

EP  3 624 192 A1  3/2020
FR  3 042 913 A1  4/2017
(Continued)

OTHER PUBLICATIONS

French Preliminary Search Report dated Nov. 25, 2020 in French Application 2003427 filed Apr. 6, 2020 (with English Translation of Categories of Cited Documents), 1 page.
(Continued)

*Primary Examiner* — Robert K Carpenter
(74) *Attorney, Agent, or Firm* — Oblon, McClelland, Maier & Neustadt, L.L.P.

(57) ABSTRACT

Photo-emitting and/or photo-receiving diode array device, comprising:
  a stack of first and second semiconductor layers doped according to different types;
  first trenches passing through the stack and surrounding a region of the stack wherein several diodes are formed;
  dielectric portions arranged in the first trenches and covering lateral flanks of said region over the entire thickness of the second layer and a first part of the thickness of the first layer;
  first electrically conductive portions arranged in the first trenches and covering the lateral flanks of said region over a second part of the thickness of the first layer, and forming first electrodes of the diodes of said region;
  at least one second trench partially passing through the first layer and separating the portions of the first layer from the diodes of said region.

15 Claims, 8 Drawing Sheets

(51) Int. Cl.
*H01L 25/16* (2006.01)
*H01L 31/02* (2006.01)
*H01L 31/101* (2006.01)
*H01L 31/18* (2006.01)

(52) U.S. Cl.
CPC ............ *H01L 31/101* (2013.01); *H01L 31/18* (2013.01); *H01L 33/0093* (2020.05); *H01L 33/0095* (2013.01)

(56) References Cited

U.S. PATENT DOCUMENTS

| | | | |
|---|---|---|---|
| 11,121,295 B2* | 9/2021 | Daami | H01L 33/54 |
| 11,168,847 B2* | 11/2021 | Consonni | G02B 5/3016 |
| 2016/0043119 A1 | 2/2016 | Lee et al. | |
| 2018/0315738 A1 | 11/2018 | Bono et al. | |
| 2019/0043901 A1 | 2/2019 | Honda et al. | |
| 2019/0355786 A1 | 11/2019 | Iguchi | |
| 2020/0091224 A1 | 3/2020 | Bono et al. | |
| 2020/0185578 A1* | 6/2020 | Daami | H01L 33/0095 |
| 2020/0335484 A1 | 10/2020 | Bono et al. | |
| 2020/0343296 A1* | 10/2020 | Gasse | H01L 27/156 |
| 2021/0126157 A1* | 4/2021 | Dupre | H01L 27/14643 |
| 2021/0184078 A1* | 6/2021 | Gasse | H01L 33/0066 |
| 2021/0247033 A1* | 8/2021 | Consonni | F21K 9/65 |

FOREIGN PATENT DOCUMENTS

| | | |
|---|---|---|
| FR | 3 073 669 A1 | 5/2019 |
| WO | WO 2017/068029 A1 | 4/2017 |

OTHER PUBLICATIONS

Martinez et al., "Mechanisms of copper direct bonding observed by in-situ and quantitative transmission electron microscopy" Thin Solid Films 530 (2013), 4 pages.

* cited by examiner

PHOTO-EMITTING AND/OR PHOTO-RECEIVING DIODE ARRAY DEVICE

TECHNICAL FIELD

The invention relates to the field of photo-emitting diode devices, such as light-emitting diodes (called LEDs, or micro-LEDs), and/or photo-receiving diodes such as photodiodes. The invention applies in particular to the following fields:

- LED lighting devices, electronic devices comprising LED arrays such as screens, projectors, video walls, or lighting devices such as for example headlamps for vehicles;
- photo-receiving electronic or microelectronic devices comprising arrays of photodiodes, such as image sensors;
- devices comprising both photo-emitting diodes and photo-receiving diodes, forming for example both a sensor and a screen.

PRIOR ART

In a photo-emitting and/or photo-receiving diode device, it is often advantageous to increase the resolution of the device, i.e. to increase the number of active cells, or pixels, per unit surface area of the device. This increase in the resolution involves decreasing the unit size of the pixels while still trying to not increase the cross-talk, i.e. the optical interferences that occur between adjacent pixels and to minimise the decrease in performance of the diodes generally observed on small pixels.

Document FR 3 042 913 describes a technology for manufacturing photo-emitting and/or photo-receiving diode arrays wherein the pixels are produced in a self-aligned manner using a single level of lithography that makes it possible to both physically separate the different diodes by creating mesa structures, and to take the electrical contact of the N-doped portion of each diode only by a contact with the lateral flanks of this portion. With this technique, each photo-emitting and/or photo-receiving diode is defined by the size of the mesa structure manufactured and the trenches etched pass through the entire thickness of epitaxy semiconductor to form the diodes, to the substrate.

This etching defining the pixels causes defects in the semiconductor material because it damages all the lateral flanks of the mesa structures, thus causing a decrease in performance, in particular the external quantum efficiency (EQE), of the photo-emitting and/or photo-receiving diodes when their size decreases.

In addition, the method proposed in document FR 3 042 913 does not allow the production of a photo-emitting and/or photo-receiving diode array with a variable diode density within the array while still retaining homogeneous performance over the entire surface of the array. The involved technological methods for manufacturing are furthermore hardly compatible with variations in the density of patterns within the array.

DISCLOSURE OF THE INVENTION

Thus there is a need to propose a photo-emitting and/or photo-receiving diode array device of which the structure allows for a production by limiting the damage of the lateral flanks of the diodes, and that is compatible with a variable diode density within the array.

For this, one embodiment proposes a photo-emitting and/or photo-receiving diode array device, forming an array of pixels of the device, comprising at least:

- a stack of at least one first and one second semiconductor layers doped according to different types of conductivity, each one of the diodes comprising a portion of the first layer superimposed on a portion of the second layer;
- first trenches passing through the entire thickness of the second layer and at least one part of the thickness of the first layer and surrounding at least one region of the stack wherein several diodes are formed;
- dielectric portions arranged in the first trenches and covering the lateral flanks of said region of the stack over the entire thickness of the second layer and a first part of the thickness of the first layer;
- first electrically conductive portions arranged in the first trenches, covering the lateral flanks of said region of the stack over a second part of the thickness of the first layer not covered by the dielectric portions and/or covering bottom walls of the first trenches, and forming at least one part of the first electrodes of the diodes formed in said region of the stack;
- at least one second trench partially passing through the thickness of the first layer from a face opposite the one located facing the second layer, i.e. from a first face of the first layer opposite to a second face of the first layer facing the second layer, and separating the portions of the first layer from the diodes formed in said region of the stack without passing through the interface between the first and second layers;
- several second electrodes electrically insulated from one another and each one electrically connected to one of the portions of the second layer of the diodes formed in said region of the stack.

The portions of the second layer of the diodes formed in said region of the stack form a continuous semiconductor portion which is not crossed, or passed through, by the first and second trenches.

In such a device, the lateral flanks, or sides, of the diodes defined by the second trench or trenches are not damaged at the interface between the first and second layers since the second trench or trenches do not pass through this interface (the second trenches pass through only a part of the thickness of the first layer). The decrease of the performance of the photo-emitting and/or photo-receiving diodes due to the first trenches is therefore less, even zero, in relation to that observed when all the lateral flanks of all the diodes of the array are etched over the entire thickness of the stack of layers from which the diodes are produced.

The second trenches do not pass through the interface between the first and second layers in order to not damage the lateral flanks of the diodes defined by the second trenches. In other words, the parts of this interface facing, or in line with, the second trenches are crossed by neither these second trenches nor other trenches. In addition, the first trenches surround at least a region of the stack in which several diodes are formed, and these diodes are not separated one to the other by the first trenches.

Thus, the structure proposed here makes it possible, thanks to the second trenches, to reduce or even suppress the dependency on the EQE of the diodes of the array according to the size of the diodes.

In addition, this structure also makes it possible to easily modulate the resolution within the array of pixels since the initial resolution of the array defined by the first trenches can be modified locally in one or more regions of the array by defining diodes of smaller dimensions via the producing of the second trench or trenches.

Here and throughout the rest of the document, the term "diode" is used to designate a photo-emitting diode, such as for example a LED, or a photo-receiving diode, such as for example a photodiode.

The semiconductors of the first and second layers are doped according to different types of conductivity, i.e. one of the first and second layers comprises a p-type doped semiconductor and the other of the first and second layers comprises an n-type doped semiconductor.

In the definition hereinabove of the device, the first part of the thickness of the first layer is arranged between the second layer and the second part of the thickness of the first layer.

Although the second trench or trenches do not pass through the second layer and do not pass through the interface between the first and second layers, this or these second trenches provide an optical insulation between the diodes of which the portions of the first layer are separated by this or these second trenches.

The device may further comprise at least one second electrically conductive portion arranged in the second trench. The presence of this second electrically conductive portion in the second trench improves the optical insulation between the pixels of which the portions of the first layer are separated by this second trench.

In addition, the second electrically conductive portion may be electrically coupled to the first electrically conductive portions and may form, with the first electrically conductive portions, the first electrodes of the diodes. This electrical coupling between the second electrically conductive portion or portions and the first electrically conductive portions is for example obtained by producing the first and second trenches according to patterns that cross or are superimposed at certain locations.

The material of the second electrically conductive portion or portions may be advantageously optically reflecting. Thus, when the diodes correspond to photo-emitting diodes, the presence of this optically reflecting material improves the extraction of the light emitted by the diodes. When the diodes correspond to photo-receiving diodes, the presence of this optically reflecting material prevents, at a pixel, the dispersion of the radiation received in the adjacent pixels. Whether the diodes are photo-emitting or photo-receiving, the presence of such a material therefore limits the cross-talk between the adjacent diodes.

The first trenches and the first electrically conductive portions may pass through the entire thickness of the stack, or the entire thickness of the second layer and only a part of the thickness of the first layer.

In a particular configuration:
all the diodes of the array may be formed in said region of the stack, and
each one of the diodes of the array may be separated from one or more adjacent diodes by at least one of the second trenches.

This configuration is very advantageous because no lateral flank of the diodes of the array is damaged (those located at the periphery of the array may for example be part of the non-functional or unused pixels, then called mechanical pixels).

The performance of the diodes of the array is then very good, similar or identical to diodes of equal size at the total dimensions of the array.

According to another configuration:
the first trenches may surround several regions of the stack wherein the diodes of the array are formed, and one or more of these regions may each comprise the second trench or several second trenches.

This other configuration may in particular be used when the diode array is produced with different regions that have different pixel resolutions. In this configuration, the first trenches may define the minimum resolution within the array, and the second trench or trenches may be formed in one or more regions of the array where the pixel resolution is higher.

The region or regions of the stack comprising the second trench or trenches (those that have a higher resolution) may form a central part of the diode array.

The device may further comprise an electronic control circuit whereon the stack of the first and second layers is arranged and to which the first and second electrodes of the diodes are electrically coupled.

The device may be such that:
the diodes correspond to photodiodes, the stack further comprising at least one intrinsic semiconductor layer or unintentionally doped arranged between the first and second layers and such that lateral flanks of the intrinsic semiconductor layer present in the first trenches are covered by the dielectric portions, the second trenches not passing through the intrinsic semiconductor layer, or
the diodes correspond to LEDs, the stack comprising at least one quantum well emissive layer arranged between the first and second layers and such that lateral flanks of the emissive layer present in the first trenches are covered by the dielectric portions, the second trenches not passing through the emissive layer.

The second trenches do not pass through the intrinsic semiconductor layer or the emissive layer and therefore do not provoke any defect in this layer.

Another embodiment relates to a method for producing a photo-emitting and/or photo-receiving diode array device, comprising at least the steps of:
producing a stack of at least one first and one second semiconductor layers doped according to different types of conductivity, each one of the diodes being intended to comprise a portion of the first layer superimposed on a portion of the second layer;
producing several second electrodes electrically insulated from one another and each one electrically connected to one of the portions of the second layer of the diodes intended to be formed in said region of the stack;
producing first trenches passing through the entire thickness of the second layer and at least one part of the thickness of the first layer and surrounding at least one region of the stack wherein several diodes are intended to be formed;
producing dielectric portions arranged in the first trenches and covering the lateral flanks of said region of the stack over the entire thickness of the second layer and a first part of the thickness of the first layer;
producing first electrically conductive portions arranged in the first trenches, covering the lateral flanks of said region of the stack over a second part of the thickness of the first layer not covered by the dielectric portions and/or covering bottom walls of the first trenches, and forming at least one part of the first electrodes of the diodes intended to be formed in said region of the stack;
producing at least one second trench partially passing through the thickness of the first layer from a face opposite the one located facing the second layer, i.e. from a first face of the first layer opposite to a second face of the first layer facing the second layer, and separating the portions of the first layer from the diodes formed in said region of the stack without passing through the interface between the first and second layers;

and wherein the portions of the second layer of the diodes produced in said region of the stack form a continuous semiconductor portion which is not crossed, or passed through, by the first and second trenches.

In the method hereinabove, the order of the implementation of the steps does not necessarily correspond to the order wherein these steps are numbered hereinabove.

The stack may be produced by epitaxy on a substrate such that the first layer is arranged between the substrate and the second layer.

According to a first embodiment, the first trenches, the dielectric portions and the first electrically conductive portions may be produced by implementing the following steps:

after producing the second electrodes, first etching of the stack through the second layer and the first part of the thickness of the first layer, according to a pattern defining the first trenches, forming first parts of the first trenches, then
  producing dielectric portions covering the lateral flanks, or sides, of the first parts of the first trenches, then
  second etching of the stack through at least one part of a remaining thickness of the first layer and according to the pattern defining the first trenches, completing the producing of the first trenches, then
  deposition of at least one electrically conductive material in the first trenches, forming the first electrically conductive portions.

In addition, the method may further comprise, after producing the first electrically conductive portions and before producing the second trench, the implementing of the following steps:

making the stack integral with a support such as the stack is arranged between the substrate and the support, then removing the substrate.

After the production of the second trench, it is possible to deposit an electrically conductive material in the second trench, this electrically conductive material forming at least one second electrically conductive portion arranged in the second trench.

In the first embodiment, after the removing of the substrate and when the second etching of the stack is carried out through only a part of the remaining thickness of the first layer, it is possible to implement a thinning of the first layer from the face of the first layer arranged beforehand against the substrate. This thinning is for example stopped on the first electrically conductive portions.

According to a second embodiment, the first trenches, the dielectric portions, the first electrically conductive portions and the second trench may be produced by implementing the following steps:

after producing the second electrodes, first etching of the stack through the second layer and a part of the thickness of the first layer, according to a pattern defining the first trenches, forming first parts of the first trenches, then
  producing dielectric portions covering the lateral flanks of the first parts of the first trenches, then
  deposition of at least one electrically conductive material in the first parts of the first trenches, forming first parts of the first electrically conductive portions, then
  making the stack integral with a support such as the stack is arranged between the substrate and the support, then
  removing the substrate, exposing the first face of the first layer, then
  second etching of the stack through the first face of the first layer and according to a pattern defining the first and the second trenches, with stopping on the first parts of the first electrically conductive portions, forming second parts of the first trenches and the second trench, then
  deposition of the electrically conductive material in the second parts of the first trenches and in the second trench, completing the production of the first electrically conductive portions and of at least one second electrically conductive portion arranged in the second trench.

This second embodiment has the advantage to allow for a carrying out of first trenches with a smaller width due to the fact that the first trenches are produced with two separate etching steps, on each side of the stack, and therefore makes it possible to increase the total emissive surface and/or to decrease the pixilation pitch of the array with a constant emissive surface when the diodes are photo-emitting.

According to a third embodiment, the first trenches, the dielectric portions, the first electrically conductive portions and the second trench may be produced by implementing the following steps:

after producing the second electrodes, making the stack integral with a support such as the stack is arranged between the substrate and the support, then
  removing the substrate, exposing a first face of the first layer, then
  first etching of the stack through the first and second layers, according to a pattern defining the first trenches, forming the first trenches, then
  producing dielectric portions covering the lateral flanks of the first parts of the first trenches, then
  deposition of at least one electrically conductive material in the first trenches, forming the first electrically conductive portions, then
  second etching of the stack through a part of the thickness of the first layer and according to a pattern defining the second trench, forming the second trench.

After the second etching of the stack, it is possible to implement a deposition of at least one electrically conductive material in the second trench, forming the second electrically conductive portion.

According to a fourth embodiment, the first trenches, the dielectric portions, the first electrically conductive portions and the second trench may be produced by implementing the following steps:

after producing the second electrodes, first etching of the stack through the second layer and the first part of the thickness of the first layer according to a pattern defining the first trenches, forming the first trenches, then
  producing dielectric portions covering the lateral flanks of the first trenches, then
  deposition of at least one electrically conductive material in the first trenches, forming the first electrically conductive portions that cover the bottom walls of the first trenches, then
  making the stack integral with a support such as the stack is arranged between the substrate and the support, then
  removing the substrate, exposing a first face of the first layer, then second etching of the stack through the first face of the first layer and according to a pattern defining the second trench, forming the second trench.

After the second etching of the stack, it is possible to implement a deposition of at least one electrically conductive material in the second trench, forming the second electrically conductive portion. It is also possible to implement a thinning of the first layer from the first face of the first layer.

The support whereon the stack is made integral may be for example an electronic control circuit, comprising for example CMOS electronic components, whereon the diodes are disposed and to which the diodes are electrically connected. Such an electronic circuit may in particular be used to electrically control the diodes when they correspond to photo-emitting diodes. Alternatively, when the diodes are photo-receiving, this electronic circuit may be used to process the signals outputted by the diodes.

Alternatively, the support may correspond to a passive element that does not comprise any electronic components, such as for example a network of interconnections, a card or an organic substrate.

The making integral of the stack on the support comprises electrical connections and the making integral is then done for example using a method of hybridisation, direct bonding or hybrid bonding.

BRIEF DESCRIPTION OF THE DRAWINGS

The present invention shall be better understood when reading the description of embodiments given solely as an indication and in no way limiting, in reference to the accompanying drawings wherein.

Identical, similar or equivalent parts of the various figures described hereinafter bear the same numerical references in order to facilitate passing from one figure to the next.

The various portions shown on the figures are not necessarily shown according to a uniform scale, in order to make the figures more legible.

The various possibilities (alternatives and embodiments) must be understood as not being exclusive from one another and can be combined together.

DETAILED DISCLOSURE OF PARTICULAR EMBODIMENTS

Figure 1:
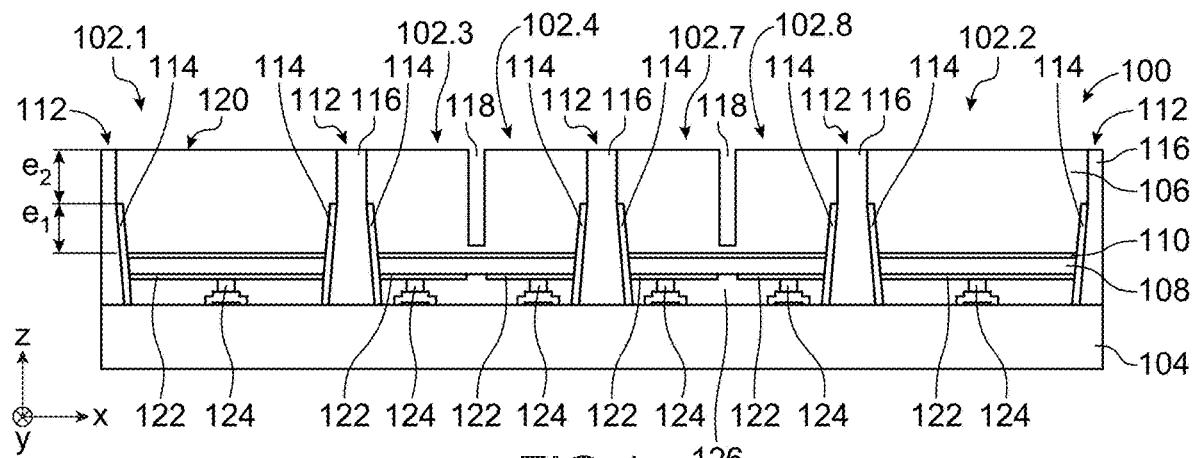
FIGS. 1 and 2 show a first example embodiment of a photo-emitting and/or photo-receiving diode device.
Figure 2:
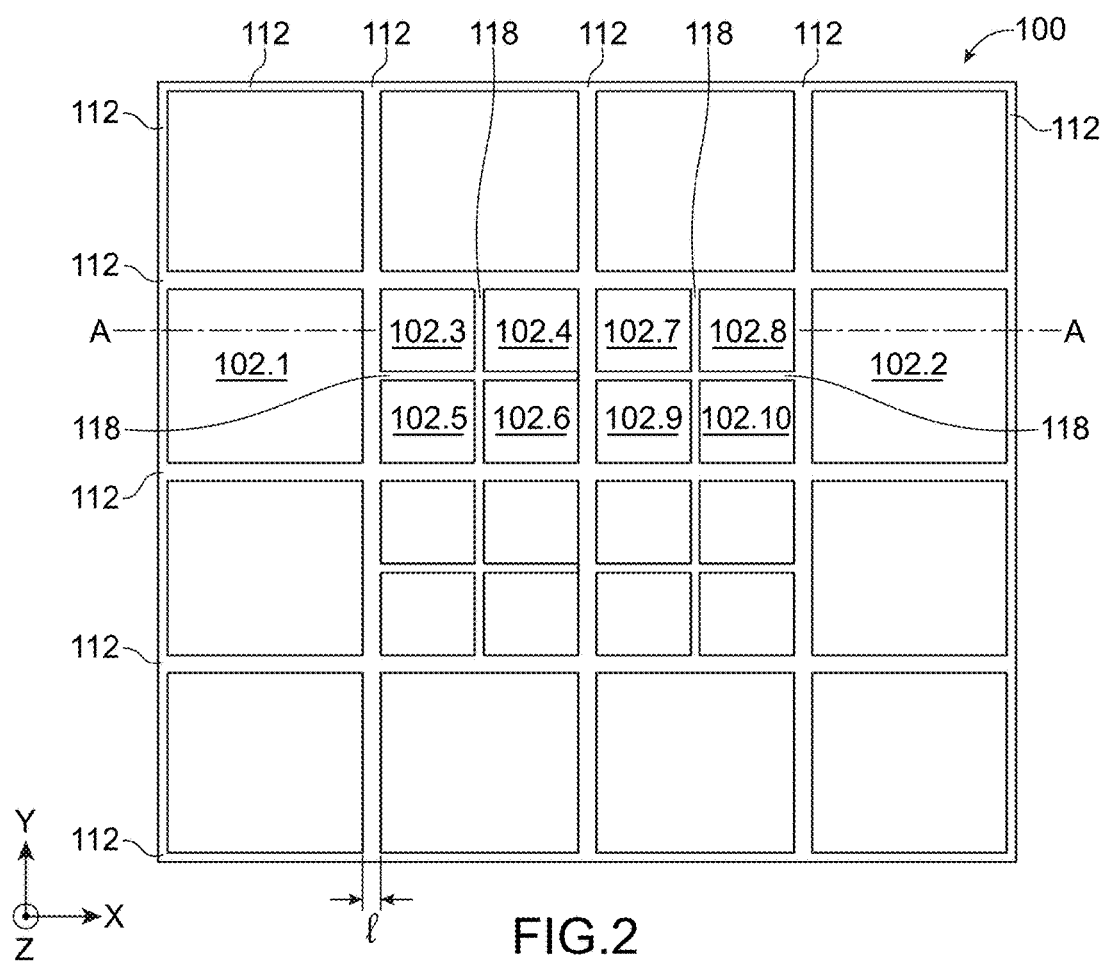

A photo-emitting and/or photo-receiving diode 102 array device 100, according to a first embodiment, is described herein below in relation with FIGS. 1 and 2. FIG. 1 shows a cross-section view of the device 100 along an axis AA shown in FIG. 2, and FIG. 2 shows a top view of the device 100. FIGS. 1 and 2 correspond to partial views showing only a part of the device 100.

The device 100 comprises several diodes 102 arranged in an array. Each diode 102 may be considered as forming a pixel of the array of the device 100. Furthermore, in this first embodiment, the diodes 102 correspond to photo-emitting diodes, here LEDs or micro-LEDS.

The device 100 comprises a support 104 whereon the diodes 102 are arranged. In the first embodiment described here, the support 104 corresponds to an electronic control circuit, comprising for example CMOS electronic components, whereon the diodes 102 are arranged and to which the diodes 102 are electrically connected. Such an electronic circuit may in particular be used to electrically control the diodes 102 when they correspond to photo-emitting diodes. Alternatively, when the diodes 102 are photo-receiving, this electronic circuit may be used to process the signals outputted by the diodes 102.

Alternatively, the support 104 may correspond to a passive element that does not comprise any electronic components, such as for example a network of interconnections, a card or an organic substrate.

The diodes 102 are produced in a stack of at least one first semiconductor layer 106 disposed on a second semiconductor layer 108. Furthermore, in this first embodiment, the stack also comprises one or more emissive layers 110 disposed between the first and second layers 106, 108 and intended to each form, in the diodes 102, quantum wells.

The first and second layers 106, 108 and the emissive layer or layers 110 may comprise one or more semiconductors of the III-V type, and advantageously GaN and/or InGaN. It is also possible that this or these semiconductor materials correspond to one or more of the following semiconductors: AlGaN, AlGaInN, InP, InGaP, AlGaP, AlGaInP, GaAs, InGaAs, AlGaAs.

The semiconductors of the layers 106 and 108 are doped according to different types of conductivity. In the first embodiment described here, the semiconductor of the first layer 106 is n doped and that of the second layer 108 is p doped. Alternatively, it is possible that the semiconductor of the first layer 106 by p doped and that of the second layer 108 be n doped.

According to a first configuration, the first layer 106 may correspond to a superposition of several separate semiconductor layers, for example an n+ doped semiconductor layer with a concentration in donors for example between about $5.10^{17}$ and $5.10^{20}$ donors/cm$^3$ on which is disposed another n− doped semiconductor layer (with a concentration of donors less than that of the n+ doped semiconductor layer) for example between about $10^7$ and $5.10^9$ donors/cm$^3$. For example, the n+ doped semiconductor layer may comprise GaN and the n− doped semiconductor layer may comprise InGaN. The thickness of the n+ doped semiconductor layer is for example greater than about 100 nm, and for example equal to about 3 µm, and that of the n-doped semiconductor layer is for example between about 5 nm and 500 nm. The n+ doped semiconductor layer may form a buffer layer disposed between n− doped semiconductor layer and a substrate (not shown in FIGS. 1 and 2, and which corresponds to the substrate from which the stack of layers is produced) used in particular to filter the growth defects of the n− doped semiconductor layer so that these defects are not in this n+ doped layer. The total thickness of the first layer 106, i.e. the sum of the thicknesses of the − and n+ semiconductor layers, is for example between about 20 nm and 10 μm, and more preferably between about 2 μm and 4 μm.

According to a second configuration, the first layer 106 may correspond to a single n doped semiconductor layer, and with a concentration of donors for example between about $10^7$ and $5.10^0$ donors/cm$^3$, comprising for example GaN and of which the thickness is for example between about 20 nm and 10 μm, and advantageously between about 2 am and 4 μm.

The emissive layer or layers 110 comprise so-called intrinsic semiconductor materials, i.e. unintentionally doped (of concentration in residual donors $n_{r}id$ for example equal to about $10^7$ donors/cm$_3$, or between about 1015 and $10^8$ donors/cm$^3$). The emissive layer or layers 110 comprise for example InGaN. The emissive layer 110 or each one of the emissive layers 110 is arranged between two barrier layers (not shown in the figures), comprising for example GaN. The emissive layer or layers 110 are arranged on the first layer 106. The thickness of the or of each one of the emissive layers 110 is for example equal to about 3 nm and more generally between about 0.5 nm and 10 nm, and the thickness of each one of the barrier layers is for example between about 1 nm and 25 nm.

The second layer 108 is arranged on the emissive layer or layers 110, or directly on the first layer 106 when the stack does not comprise an emissive layer 110. The semiconductor of the second layer 108 is for example GaN and its thickness is for example between about 20 nm and 10 m. The second layer 108 has for example a concentration of acceptors between about $10^{17}$ and $5.10^{19}$ acceptors/cm$^3$.

In an embodiment alternative, an electron blocking layer (not shown in FIGS. 5 to 9) may be arranged between the second layer 108 and the emissive layer or layers 110, this electron blocking layer comprising for example AlGaN with for example about 12% aluminium and p doped with a concentration of acceptors for example equal to about $1.10^{17}$ acceptors/cm$^3$.

Materials other than those mentioned hereinabove may be used to make the stack of layers described hereinabove.

Superimposed portions of the layers 106, 108, 110 of this stack form p-n junctions (or more precisely p-i-n in this first embodiment, due to the presence of the layer or layers 110 which are not intentionally doped and which are arranged between the layers 106, 108) of the diodes 102.

The device 100 also comprises first trenches 112 that, in this first embodiment, pass through the entire thickness of the stack of layers 106, 108, 110. These first trenches 112 are for example produced by forming a grid pattern. These first trenches 112 delimit several regions of the stack (and more generally at least one region of the stack) forming the p-n junctions of the diodes 102. The distance between two first adjacent trenches 112 and parallel to one another is for example equal to about 90 μm. In the embodiment described here, the diodes 102 will be produced in the form of structures mesa, or structures in islands, delimited by the first trenches 112. The regions of the stack surrounded by the first trenches 112 have for example a section, in a plane parallel to the face of the support 104 whereon the stack is, for example in the shape of a disc or rectangle or more generally a polygon (square shape in the example of FIGS. 1 and 2).

In the first embodiment described here, the first trenches 112 are regularly spaced from one another and delimit regions of the stack of dimensions that are substantially similar to each other.

Dielectric portions 114 are arranged in each one of the first trenches 112 and cover lateral flanks of the regions of the stack surrounded by the first trenches 112. The dielectric portions 114 cover these lateral flanks over the entire thickness of the second layer 108 and of the layer or layers 110, as well as on a first part of the thickness of the first layer 106. In FIG. 1, this first part of the thickness of the first layer 106 is called $e_1$. According to the total thickness of the first layer 106, the first part of the thickness of the first layer 106 $e_1$ is for example between about 100 nm and 5 μm. The dielectric portions 114 comprise for example SiO$_2$ and/or SiN.

First electrically conductive portions 116 are arranged in each one of the first trenches 112. These first portions 116 cover the lateral flanks of the regions of the stack surrounded by the first trenches 112. The first portions 116 cover these lateral flanks over a second part of the thickness of the first layer 106. In FIG. 1, this second part of the thickness of the first layer 106 is called $e_2$. Thus, the first portions 116 are electrically connected to the n-doped semiconductor material of the first layer 106. In addition, thanks to the presence of the dielectric portions 114 in each one of the first trenches 112, the first electrically conductive portions 116 are electrically insulated from the second layer 108 and from the layer or layers 110. With the goal of optimising the quality of the electrical contact between the first electrically conductive portions 116 and the first layer 106, it will be sought to maximise the ratio e2/e1.

The device 100 also comprises second trenches 118 (and more generally at least one second trench 118) partially passing through the thickness of the first layer 106 from one face 120 of the first layer 106 opposite that located facing, or on the side, of the second layer 108. This face 120 corresponds to the emissive face of the diodes 102. These second trenches 118 separate, within one or more regions of the stack surrounded by the first trenches 112, several portions from the first layer 106 in order to optically separate, within the or each one of these regions of the stack, several diodes 102. The thickness of the first layer 106 which is not passed through by the second trenches 118 is for example between 20 nm and 500 nm, or between 100 nm and 500 nm. It is possible that the thickness of the first layer 106 that is not passed through by the second trenches 118 is equal to $e_1$.

The width of each one of the first and second trenches 112, 118 (dimension according to the X axis in FIG. 1) is for example between about 0.5 μm and 5 μm. The widths of the first trenches 112 may be similar or different from those of the second trenches 118.

According to an alternative embodiment (which does not correspond to the one shown in FIGS. 1 and 2), the second trenches 118 may be filled at least partially with one or more optically reflecting materials, for example one or several metal materials, forming second electrically conductive portions. The second electrically conductive portions make it possible to improve the optical insulation between the pixels produced in the same region of the stack surrounded by first trenches 112.

The material of the first electrically conductive portions 116, and optionally that of the second electrically conductive portions when such second portions are present in the second trenches 118, correspond for example to one of the following materials: Al, Ag, Au, Cu.

When no electrically conductive material is arranged in the second trenches 118, the first electrically conductive portions 116 form first electrodes of the diodes 102 electrically connected to the n-doped semiconductor of the diodes 102. In the first embodiment described here, the first electrodes of all the diodes 102 of the array of the device 100 are formed by the first portions 116 and are electrically connected together, for example at an edge of the array, and form a first electrode (here a cathode) that is common to all these diodes 102. In the first embodiment, although this is not shown in FIGS. 1 and 2, the first electrodes are electrically connected to the control circuit forming the support 104.

When second electrically conductive portions are arranged in the second trenches 118, the first electrodes of the diodes 102 produced in the regions of the stack passed through by the second trenches 118 are formed by the first electrically conductive portions 116 and by the second electrically conductive portions.

When the second trenches 118 cross the first trenches 112, as is the case on the embodiment of FIGS. 1 and 2, the electrically conductive nature of the second electrically conductive portions makes it possible to ensure an electrical contact with the first electrodes.

In the example shown in FIGS. 1 and 2, each one of the diodes 102.1 and 102.2 is formed by a region of the stack surrounded by first trenches 112 and these regions are not passed through by second trenches 118. However, the four diodes 102.3, 102.4, 102.5 and 102.6 are formed in a single region of the stack surrounded by first trenches 112 and which is passed through by second trenches 118 separating into four portions the part of the first layer 106 of this region of the stack, each one of these four portions being a part of one of the four diodes 102.3, 102.4, 102.5 and 102.6. The same applies for the four diodes 102.7, 102.8, 102.9 and 102.10.

Each one of the diodes 102 also comprises a second electrode electrically coupled to the portion of the second layer 108 forming the p-n junction of this diode 102. In the first example embodiment described here, each second electrode is formed by an electrically conductive portion 122 disposed against the portion of the second layer 108 and by an electrical connection element 124 that connects the electrically conductive portion 122 to the electronic control circuit forming the support 104. The electrically conductive material of the portions 122 is for example optically reflecting, and corresponds for example to aluminium or silver.

For the diodes 102 formed in a region of the stack which is passed through by one or more second trenches 118, the electrically conductive portions 122 of the second electrodes of these diodes are electrically insulated from one another. The pattern etched in the electrically conductive layer (from which the portions 122 are produced) to isolate these portions 122 from one another may be similar to the one of the second trench or trenches 118 passing through the region of the stack.

Each one of the second electrodes 122 is electrically connected to the control circuit forming the support 104 individually in order to be able to individually control each one of the diodes 102. A dielectric material 126 is present around electrical connection elements 124 in order to ensure the electrical insulation thereof from one another as well as the mechanical protection thereof with respect to the environment.

In the diode array 102 of the device 100 shown in FIGS. 1 and 2, the diode density 102 within this array is not uniform. In this first example, this density is quadrupled at the centre of the array, at the four regions of the stack each surrounded by first trenches 112. The pixilation pitch of the diode array 102, i.e. the distance between the centres of two adjacent diodes 102, obtained in the regions that comprise the second trenches 118 is for example equal to 45 m, while this pixilation pitch in the regions that do not comprise the second trenches is for example equal to 90 µm. More generally, the pixilation pitch of the diodes 102 defined by the first trenches 112 is typically between about 1 µm and 500 µm.

Figure 3:
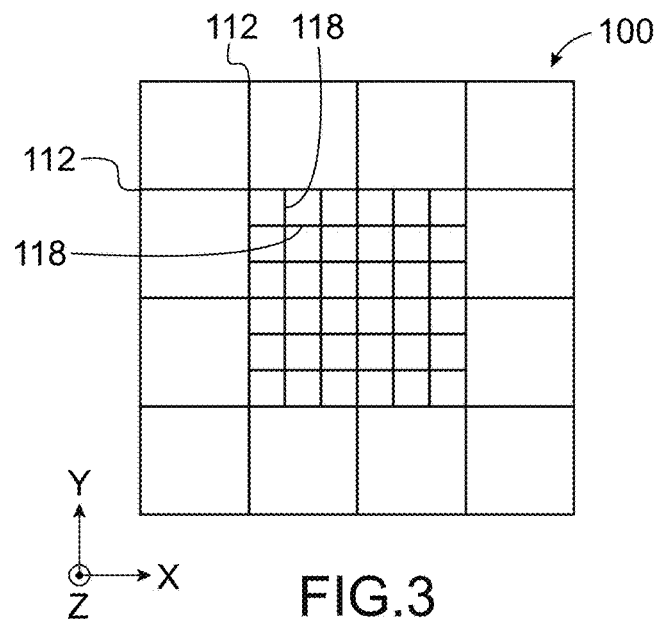
FIGS. 3 and 4 show other example embodiments of the photo-emitting and/or photo-receiving diode device.

FIG. 3 shows, diagrammatically and as a top view, another embodiment of the device 100 wherein four regions of the stack of layers are each divided into nine sub-regions each forming a diode 102. Each one of these regions of the stack is surrounded by first trenches 112. It should be noted that in this configuration, in each one of the four central regions, the sub-region that is located at the centre does not comprise a lateral flank formed by one of the first trenches 112. Thus, when the second trenches 118 are not filled with an electrically conductive material, this central sub-region does not form a diode since the semiconductor portion of the first layer 106 of this sub-region is not electrically connected to the first electrode formed in the first trenches 112. On the other hand, when the second trenches 118 are filled with second electrically conductive portions, due to the fact that the second trenches 118 cross the first trenches 112, the second electrically conductive portions are in contact electrically with the first electrically conductive portions 116 of the first electrodes. All the lateral flanks of the different sub-regions are therefore in contact electrically with an element (first electrically conductive portions 116 or second electrically conductive portions) forming a first electrode for each one of the diodes 102 of these sub-regions.

Figure 4:
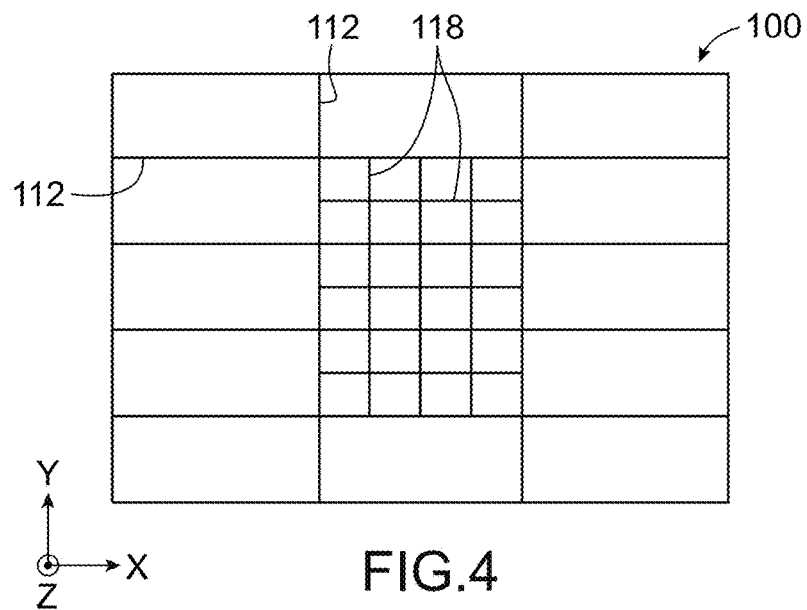

FIG. 4 shows another embodiment of the device 100 wherein three regions of the stack of layers are each divided into eight sub-regions each forming a diode 102. Each one of these regions of the stack is surrounded by first trenches 112. In this configuration, all of the p-n junctions formed in each one of these three regions comprise at least one lateral flank electrically in contact with one of the first trenches 112. All of the portions of each one of these regions form functional diodes 102, whether or not the second trenches 118 are filled with an electrically conductive material.

Generally, the number of separate diodes separated by the second trenches 118 within a region of the stack surrounded by first trenches 112 is greater than or equal to 2 and may reach several thousand and even several million or more according to the final resolution of the device.

In the examples described hereinabove, the diode density 102 is greater at the centre of the diode array 102 than on the edges of the array. Alternatively, it is possible that this higher density of diodes is located at one or more locations in the array other than the centre.

A method for producing the device 100 according to a first embodiment is described herein below in relation with FIGS. 5 to 9.

In this first embodiment, the device 100 comprises a diode array 102 forming an array of pixels of the device 100. Furthermore, in the first embodiment described herein below, the diodes 102 correspond to photo-emitting diodes, here LEDs.

Figure 5:
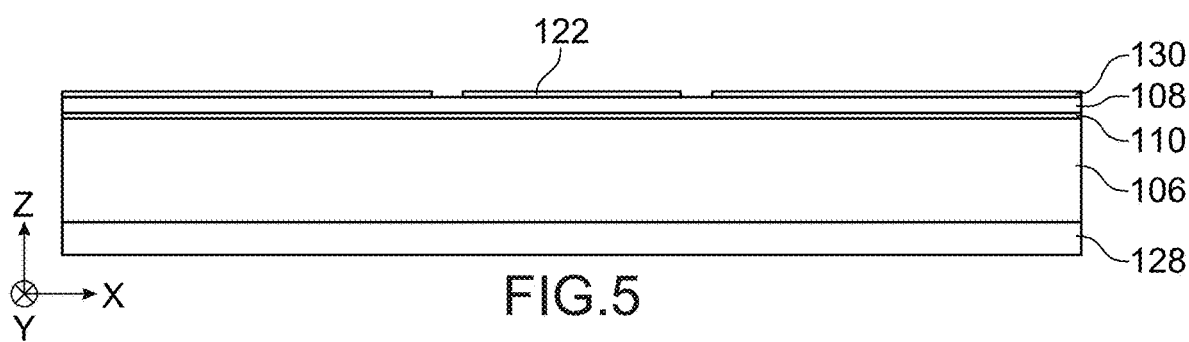
FIGS. 5 to 9 show the steps of a method for producing a photo-emitting and/or photo-receiving diode device according to a first embodiment.

As shown in FIG. 5, the device 100 is produced from a substrate 128 comprising for example sapphire and/or silicon and/or a semiconductor for example similar to the one used to form the active portion of the diodes 102, and/or carbon silicide and/or glass and/or any other material that allows the substrate 128 to form a growth substrate allowing for the producing of the semiconductor stack forming the active portion of the diodes 102 by epitaxy. The substrate 128 is used as a support for the deposition and/or the growth of layers intended for the production of the diodes 102 of the device 100.

The stack of layers from which the diodes 102 will be produced is formed on the substrate 128. This stack comprises the first semiconductor layer 106, the emissive layer or layers 110, the second semiconductor layer 108 and an electrically conductive layer 130 forming, in each of the diodes 102, the portions 122 of the second electrodes (corresponding to the anode in the example described here) that will be in contact with the semiconductor of the second layer 108. The electrically conductive layer 130 is disposed on the second layer 108.

A first step forming the electrically conductive layer 130 is implemented so as to produce the portions 122 of the second electrodes of the diodes 102. This layer 130 is for example deposited on the layer 108 then removed locally by a so called "lift-off" method in order to form the portions 122 that will be, within the same region of the stack, surrounded by first trenches 112 and comprising one or more second trenches 118, electrically insulated from one another. The structure obtained at this stage of the method is shown in FIG. 5. The zones removed from the electrically conductive layer 130 are arranged substantially facing regions where the second trenches 118 will be produced afterwards.

A layer intended to form a hard dielectric mask is then deposited on the electrically conductive layer 130. The material of this layer is for example $SiO_2$ or SiN. This layer is etched in order to form a hard dielectric mask 132 that will in particular be used as a mask for the etching of the other layers of the stack. The pattern of this hard mask 132 corresponds to that of the first trenches 112.

An etching through the layers 130, 108, 110 and a first part of the thickness of the first layer 106 is then implemented according to the pattern of the hard dielectric mask 132. This etching corresponds for example to a dry etching, for example by a $Cl_2$-based plasma or an RIE etching, for example ICP-RIE (Inductively Coupled Plasma-Reactive Ion Etching).

This etching is stopped at a level of depth located in the first layer 106 and such that the bottom walls of the etched trenches are formed by the first layer 106. The thickness of the first layer 106 etched during this etching is equal to the thickness $e_1$. This etching is carried out such that the remaining thickness of the first layer 106, i.e. the second part of the thickness of the first layer 106 $e_2$, is sufficient to carry out a good electrical contact between the semiconductor or semiconductors of the first layer 106 and the first electrically conductive portions 116 that will be produced later in the first trenches 112. This etching forms a first part of the first trenches 112.

A dielectric layer, corresponding for example to a SiN/$SiO_2$ bilayer or comprising $Al_2O_3$, and forming a passivation layer, is then deposited with a conformal thickness, for example between about 5 nm and 1 µm and advantageously equal to about 200 nm, on the hard mask 132 and along walls of the first parts of the first trenches 112, therefore covering the lateral walls formed of the hard mask 132 and regions of the stack of layers 106, 108, 110, 130 which are surrounded by the first parts of the first trenches 112 etched. The dielectric layer is also deposited on the non-etched portions of the first layer 106 forming the bottom walls of these first parts of the first trenches 112. This dielectric layer is for example produced by a deposition of the PECVD type (plasma enhanced chemical vapour deposition) or ALD (atomic layer deposition) according to the nature of the material or materials deposited.

An anisotropic etching, for example a dry etching such as an RIE etching, is then implemented such that the portions of the dielectric layer that are located in the first parts of the first trenches 112 and that do not cover the lateral walls of the first parts of the first trenches 112 are suppressed, thus exposing the parts of the first layer 106 that are located at the bottom of the first parts of the first trenches 112. The parts of this dielectric layer cover the upper face of the hard mask 132 are also suppressed. Thus, only the portions 114 of the dielectric layer covering the lateral walls of the first parts of the first trenches 112 are retained.

A second etching of the stack is implemented, extending the first trenches 112 through the remaining thickness $e_2$ of the first semiconductor layer 106 until the substrate 128 is reached, i.e. until the bottom walls of the first trenches 112 are formed by the substrate 128. This second etching makes it possible to expose parts of the lateral flanks of the first layer 106 on the second part of the thickness of the first layer 106 that will form electrical contact zones for the first electrically conductive portions 116.

Openings are then made through the dielectric mask 132, forming locations for the making of the electric connection elements 124 intended to ensure the electrical contacts with the second electrodes. These openings pass through the entire thickness of the dielectric mask 132 so that the bottom walls of these openings are formed by the electrically conductive portions 122. This etching is for example of the ICP-RIE type.

One or more electrically conductive materials are then deposited in the first trenches 112 and in the locations of the electrical connections 124, forming the first electrically conductive portions 116 and the electrical connection elements 124.

According to an embodiment, a first electrically conductive material may be deposited in the first trenches 112 and in the locations of the electrical connection elements 124 as well as on the dielectric mask 132. This first electrically conductive material is conformally deposited, i.e. by forming a layer with a substantially constant thickness on the dielectric mask 132 and along lateral walls and the bottom walls of the first trenches 112 and of the locations of the electrical connection elements 124. For example, this first electrically conductive material may be formed by the deposition, for example of the PVD type, of a first layer of titanium with a thickness for example less than about 300 nm, followed by a deposition, for example PVD, of a second layer of aluminium with a thickness for example between about 50 nm and 1 µm. The deposition techniques implemented are chosen so that they are adapted to the substantial form factor of the volumes formed by the first trenches 112, and correspond for example to those implemented for the deposition of the electrically conductive material or materials of the conductive vias or TSV (Through-Silicon Via). Then, a second electrically conductive material may be deposited by filling the remaining volumes of the first trenches 112 and of the locations of the electrical connection elements 124. The thickness of this second electrically conductive material may be such that it also covers the portions of the first electrically conductive material arranged on the dielectric mask 132. This second electrically conductive material is for example copper which may be formed by implementing a full-wafer ECD (Electro-Chemical Deposition), i.e. over the entire structure produced hereinabove. A chemical-mechanical planarization (CMP) may then be implemented in order to suppress the portions of the first and second electrically conductive materials that exceed the first trenches 112 and the locations of the electrical connection elements 124. This planarization makes it possible to complete the making of the electrically conductive portions 116 and of the electrical connections 124 and to electrically insulate these electrically conductive portions 116 with regards to the electrical connections 124.

Figure 6:
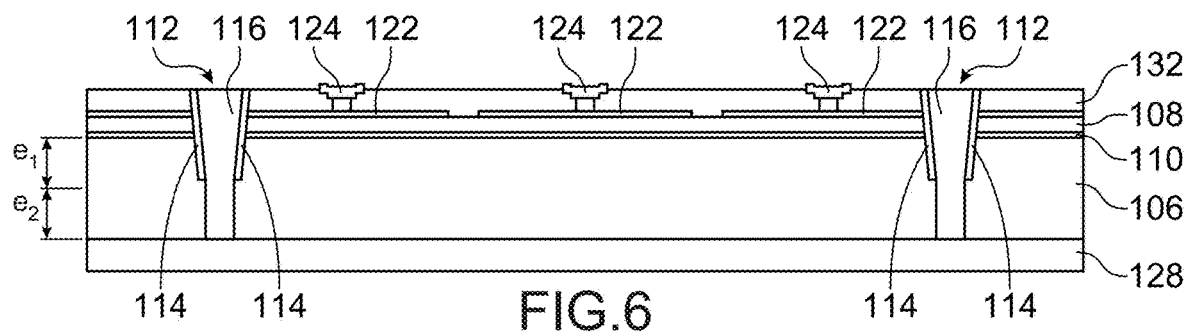

The structure obtained at this stage of the method corresponds to that shown in FIG. 6.

It should be noted that in FIGS. 5 to 9, a single region of the stack surrounded by first trenches 112 is shown. However, the device 100 comprises other region of the stack also surrounded by first trenches 112 and which are not shown in these figures.

Thanks to the vertical dielectric portions 114, the first electrically conductive portions 116 are well insulated electrically from the layers 108 and 110. The thickness of the dielectric portions 114 may be chosen such that an acceptable leakage current is tolerated on each one of the diodes 102, for example less than about 1% of the nominal current passing through the diode 102, when they are subjected to a different in potential (applied between the cathode and the anode) for example of about 4 Volts. The minimum thickness of the dielectric portions 114 is for example between about 3 nm and 5 nm, or between 3 nm and 4 nm, according to the material or materials used to produce the dielectric portions 114.

The produced structure is then hybridised on the support 104. For example, this hybridisation may correspond to a direct bonding (also called molecular bonding), or a copper-oxide hybrid bonding and Au/Au thermocompression, or make use of electrical connection elements between the diode array 102 (and more precisely the electrical connection elements 124) and the electronic circuit such as for example fusible alloy beads (comprising for example SnAg and/or indium), or copper pillars covered with a welding material, or with micro-inserts, or with micro-tubes. Details on implementing a direct bonding are for example described in the document "Mechanisms of copper direct bonding observed by in-situ and quantitative transmission electron microscopy" of M. Martinez et al., Thin Solid Films 530 (2013) 96-99.

Figure 7:
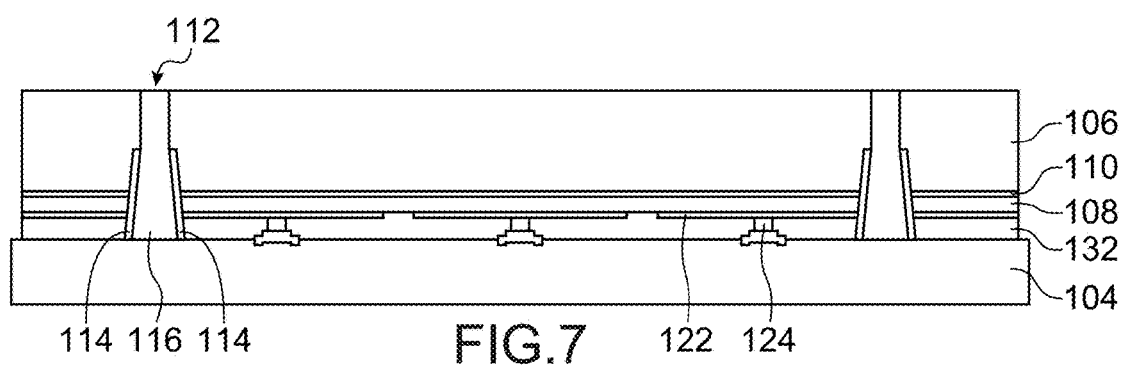

After this transfer, the substrate 128 is suppressed, thus releasing rear faces of the diodes through which the light is intended to enter or exit according to whether the diodes 102 are photo-emitting or photo-receiving diodes (see FIG. 7). The substrate 128 is for example removed by laser lift-off when the substrate 128 comprises sapphire, or by grinding and selective chemical etching when the substrate 128 comprises for example a semiconductor such as silicon.

Figure 8:
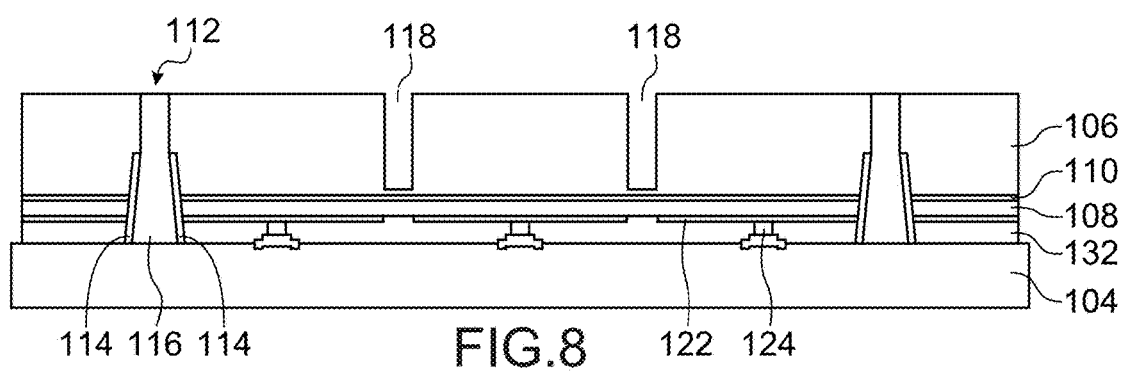

The second trenches 118 are then produced through a part of the thickness of the first layer 106, such that the bottom walls of these second trenches 118 are formed by the material of the first layer 106 (see FIG. 8). The second trenches 118 are for example produced by implementing an etching carried out by using a hard mask for example of $SiO_2$. These second trenches 118 mark the physical and optical separation between the diodes 102 produced in the region of the stack surrounded by the first trenches 112. When the second trenches 118 are intended to be filled with at least one electrically conductive material providing an electrical contact function with the semiconductor of the first layer 106, the second trenches 118 have at least one covering region with the first trenches 112 in order to ensure a continuity of the electrical contact with the semiconductor of the first layer 106.

Figure 9:
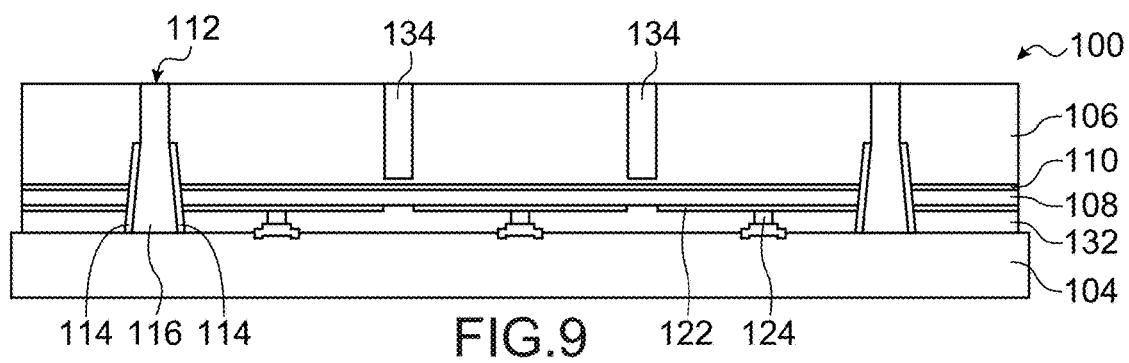

The production of the device 100 is completed by the filling of the second trenches 118 with at least one electrically conductive material forming second electrically conductive portions 134 (see FIG. 9). This filling may be obtained by implementing steps similar to those implemented to carry out the first electrically conductive portions 116. The hard mask used during the etching and the filling of the second trenches 118 may be retained if it is transparent to radiation, or suppressed, even structured (for example by photonic crystals) in order to improve the light extraction of the emission directivity.

At the end of the method, it is possible to deposit a transparent electrically conductive material, for example ITO (indium tin oxide) or AZO (zinc aluminium oxide) or GZO (zinc gallium oxide), on the upper face of the unit produced in order to improve the electrical contact between the semiconductor of the first layer 106 and the first and second electrically conductive portions 116, 134. In this case, the removal of the hard mask is necessary.

Figure 10:
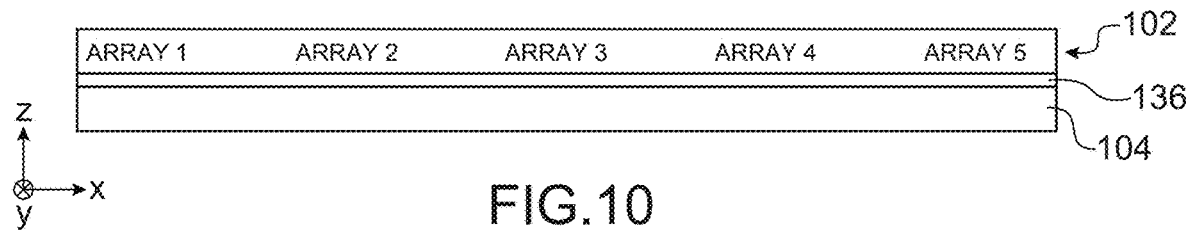
FIGS. 10 to 12 show different transfer configurations of diode arrays on a common support implemented during a method of producing a photo-emitting and/or photo-receiving diode device.

In the method described hereinabove, the transfer of the diodes 102 on the support 104 corresponds to a substrate-to-substrate attaching, or wafer-to-wafer, i.e. several diode arrays 102 are produced simultaneously in the layers 106, 108, 110 and these arrays are transferred together on a substrate forming the support 104. This configuration is diagrammed in FIG. 10, wherein the reference 136 designates the attaching interface (bonding, interconnection elements, etc.) between the diode arrays 102 and the substrate forming the support 104.

Figure 11:
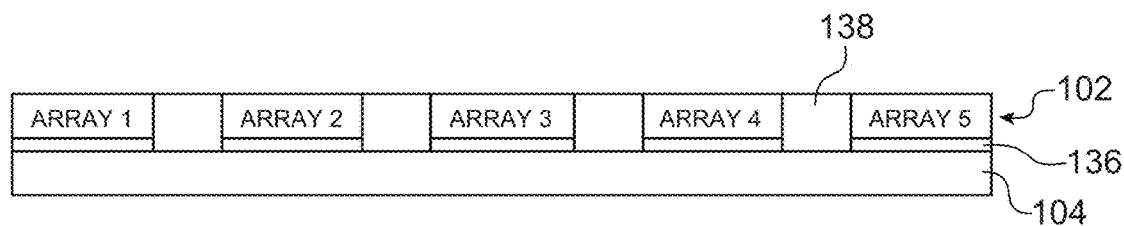

According to an alternative, it is possible that the diode arrays 102 produced simultaneously in the layers 106, 108, 110 be first cut in the form of individual chips, then transferred individually on the substrate forming the support 104. This alternative corresponds to an attaching of the chip-to-wafer type, implemented with the hybridisation techniques mentioned hereinabove. In this case, before the implementation of the steps forming the second trenches 118, the spaces between the diode arrays 102 are filled with a material 138, for example a dielectric. This configuration is diagrammed in FIG. 11.

Figure 12:
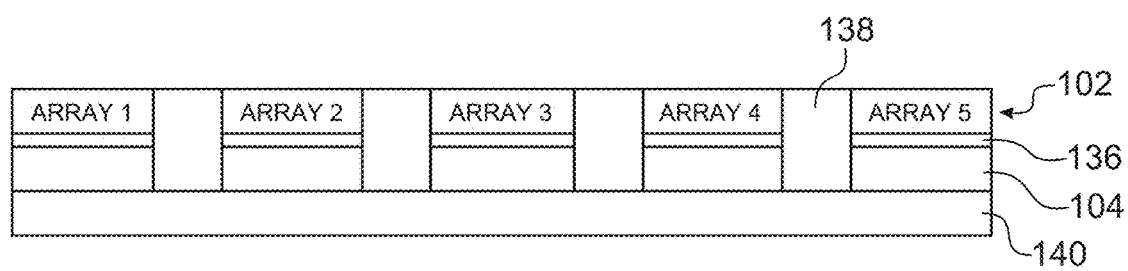

According to yet another alternative, it is possible that the diode arrays 102 produced simultaneously in the layers 106, 108, 110 be first al off cut in the form of individual chips, then transferred individually on the substrate forming the support 104 also cut beforehand in the form of individual chips. This other alternative corresponds to an attaching of the chip-to-chip type. Each unit formed of a diode array 102 and of a control circuit is then transferred on another support 140 and the spaces between the "diode array chips 102 transferred on support substrate chips 104" units are filled with a material 138, for example a dielectric. This configuration is diagrammed in FIG. 12.

In any case, at the end of the production of the devices 100, a step of cutting is implemented to separate the devices 100 from one another.

In the first embodiment described hereinabove, the first trenches 112 are produced by etching the entire thickness of the stack formed by the layers 106, 108 and 110. Alternatively, it is possible that the second etching of the stack implemented after having produced the dielectric portions 114 be carried out not through the entire remaining thickness of the first layer 106, but through only a part of this remaining thickness. In this case, the first electrically conductive portions 116 produced in the first trenches 112 are in electrical contact with the material of the first layer 106 at the portions of the lateral walls of the first trenches 112 that are not covered by the dielectric portions 114 and at the bottom walls of the first trenches 112. Then, optionally, after having transferred the stack on the support 104 and suppressed the substrate 128, it is possible to implement a thinning of the first layer 106 from the face against which the substrate 128 was located beforehand, until the first electrically conductive portions 116 is reached. This thinning makes it possible to reduce the optical cross-talk between the pixels and makes it possible to reduce the width of the first trenches 112 by retaining a constant aspect ratio (constraint with lithography and deep etching).

In relation with FIGS. 13 to 15, a method for producing the device 100 according to a second embodiment is described herein below.

In the first embodiment described hereinabove in relation with FIGS. 5 to 9, the first trenches 112 are etched, before the transfer on the support 104, through the layers 130, 106, 108 and 110 with a depth equal to the desired height for the first electrically conductive portions 116. In the second embodiment described here, the first trenches 112 are etched, before the transfer on the support 104, partially through the entire thickness of the layer 130, of the second layer 108 (and of the emissive layer or layers 110 if such layers are present in the stack) and through a part only (thickness $e_1$) of the thickness of the first layer 106.

Figure 13:
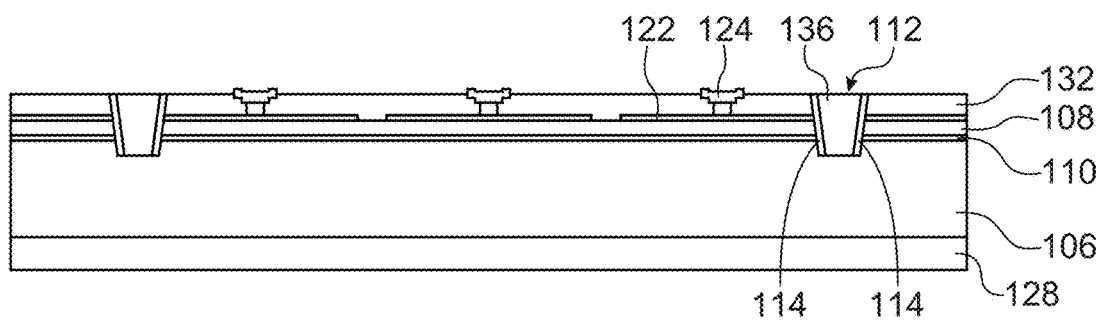
FIGS. 13 to 15 show the steps of a method for producing a photo-emitting and/or photo-receiving diode device according to a second embodiment.

The dielectric portions 114 and electrically conductive portions 136, forming first parts of the portions 116, are then produced in these parts of the first trenches 112 that do not pass through the entire thickness of the first layer 106 (see FIG. 13).

The unit is then transferred on the support 104, as in the first embodiment.

Figure 14:
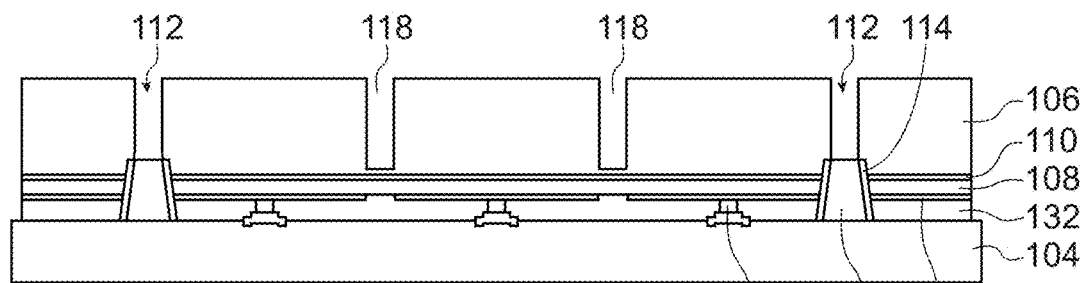

An etching is then implemented to terminate the etching of the first trenches 112 and at the same time etching the second trenches 118 (see FIG. 14).

Figure 15:
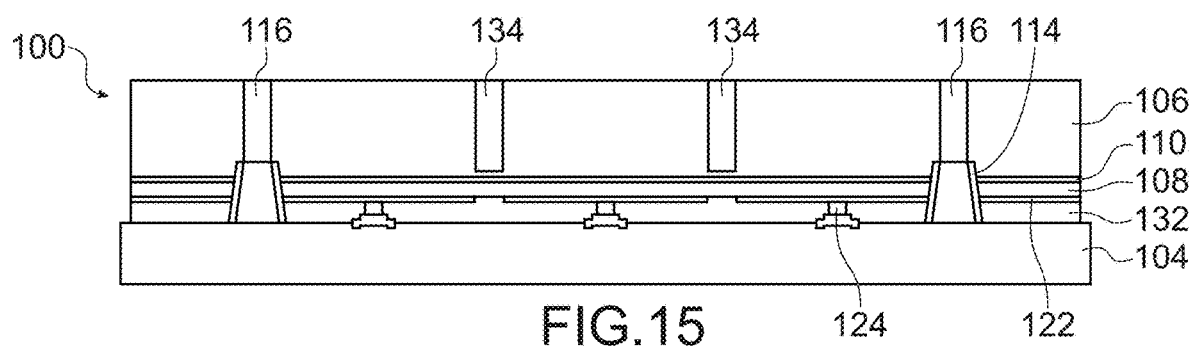

The first trenches 112 and the second trenches 118 are then filled with one or more electrically conductive materials, thus completing the producing of the first electrically conductive portions 116 and forming the second electrically conductive portions 134 (see FIG. 15).

In this second embodiment, the first electrically conductive portions 116 are therefore produced with two steps. This is advantageous because the remaining thickness (thickness $e_2$) of the first layer 106 that is not etched during the production of the first part of the portions 116 (step shown in FIG. 13) corresponds to the depth of the second trenches 118. The first parts 136 of the portions 116 then form an etching stop material during the production of the second trenches 118 and the completion of the first trenches 112.

In this second embodiment, it is also possible to carry out a thinning of the first layer 106 after the removing of the substrate 128 and before the etching of the second trenches 118. Such a thinning is clever when the first layer 106 comprises a non-doped portion arranged on the side of the substrate 128, this thinning being able to suppress this non-doped portion.

This second embodiment also makes it possible to release the constraints on the width of the first trenches 112. Indeed, given that the etching of these trenches passes through the implementation of two separate steps, on the two sides of the stack, the depth of material to be etched at each one of these two steps is therefore less than when the first trenches 112 are produced with the implementation of a single etching step, which makes it possible to reduce the aspect ratio, i.e. the ratio between the value of the depth of a trench and the value of the width of the trench) of the trenches. This thinning therefore in the end makes it possible to obtain first trenches 112 that are not as wide as when they are produced with the implementation of a single etching step through the entire thickness of the layers 130, 106, 108 and 110.

Figure 16:
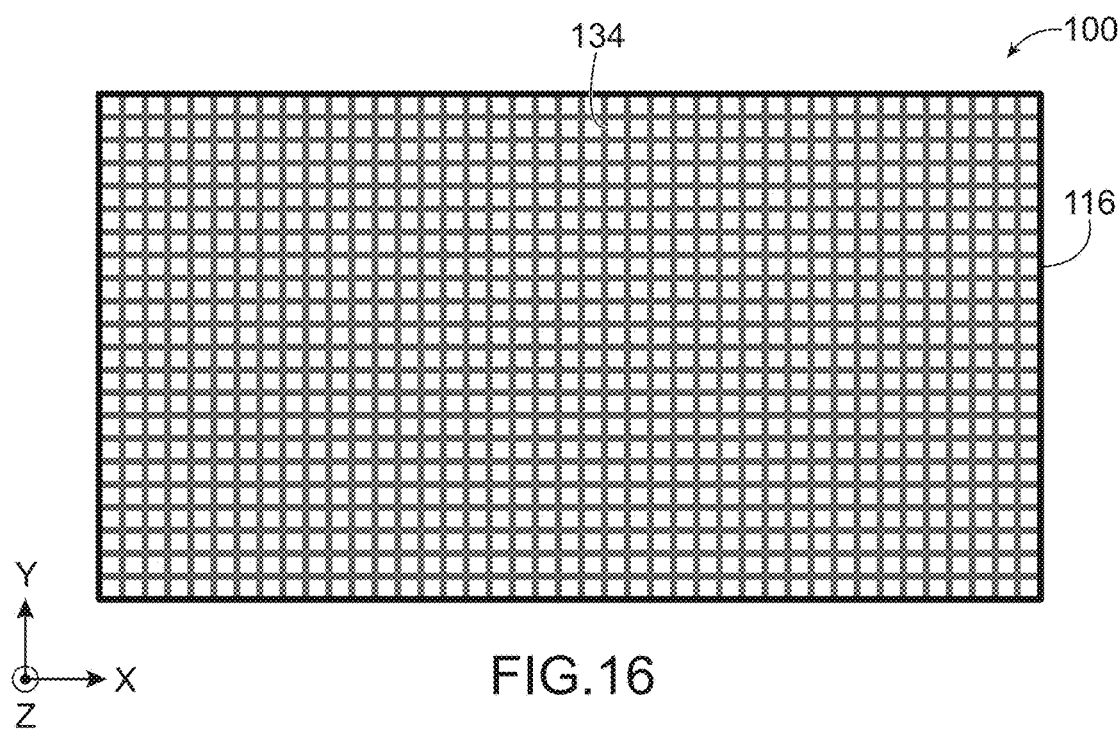
FIG. 16 shows another example embodiment of the photo-emitting and/or photo-receiving diode device.
Figure 17:
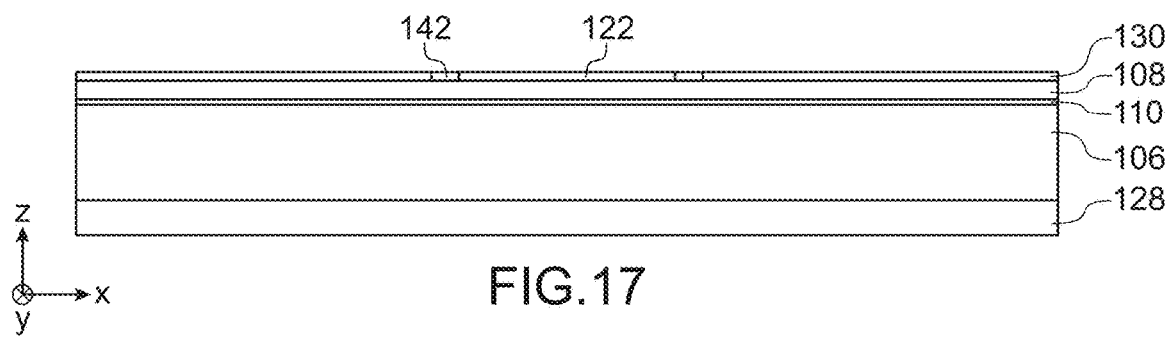
FIGS. 17 to 22 show the steps of a method for producing a photo-emitting and/or photo-receiving diode device according to a third embodiment.
Figure 18:
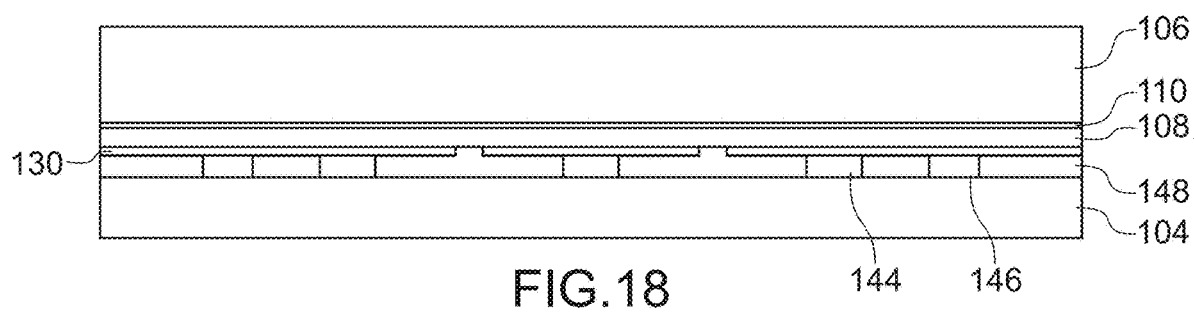

In the embodiments described hereinabove, the pixel array produced comprises several regions of the stack each surrounded by first trenches, and second trenches are produced in at least one portion of these regions. According to another embodiment, it is possible that the pixel array of the device 100 comprises a single region of the stack surrounded by first trenches 112, and that this region is passed through by second trenches 118 that therefore define the pitch of all the pixels of this array. FIG. 16 corresponds to a top view of such an embodiment. This other embodiment is very advantageous because in all the pixels of the array, there is no damage of the lateral flanks of the portions of the layers 108 and 110.

A method for producing the device 100 according to a third embodiment is described herein below in relation with FIGS. 17 to 22.

A stack similar to the one described hereinabove in relation with FIG. 5 is produced on the substrate 128. The spaces etched between the electrically conductive portions 122 are filled with a dielectric material 142 deposited and planarized with stopping on the portions 122 (see FIG. 17).

This unit is then transferred and made integral with the support 104. Prior to this transfer, first electrical contacts 144 are produced on the support 104 and are intended to be connected to the electrically conductive portions 122. Second electrical contacts 146 are also produced on the support 104 and are intended to be connected to the first electrically conductive portions 116. The first and second electrical contacts 144, 146 are connected to the electronic control circuit of the support 104 and are electrically insulated from one another by a dielectric material 148 deposited between these contacts (see FIG. 18).

After the transfer of the stack of layers 106, 108, 110, 130, the substrate 128 is removed.

The hard mask 132 is then produced on the stack, then the first trenches 112 are etched through the entire thickness of the layers 106, 108, 110, until the first electrical contacts 146 are reached.

Figure 19:
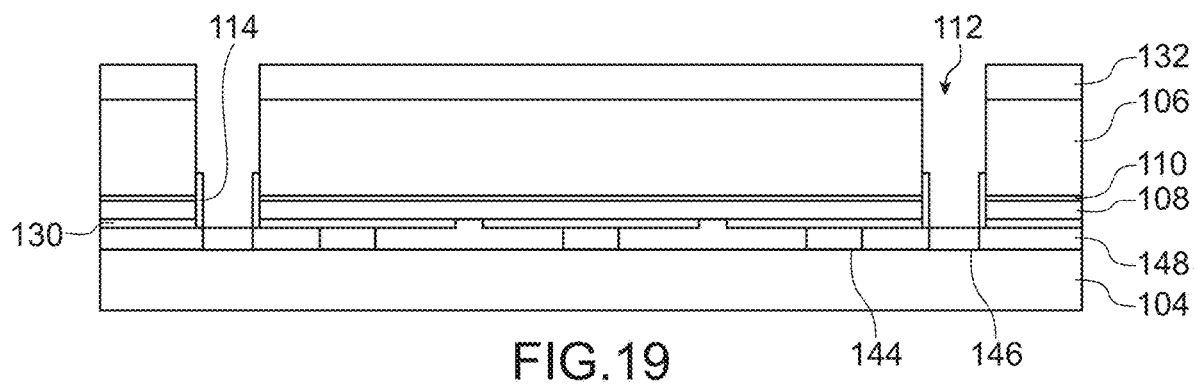

The dielectric portions 114 are then produced in the first trenches 112, against the lateral flanks of the layers 108, 110 and on the first part of the thickness $e_1$ of the first layer 106 (see FIG. 19). The dielectric portions 114 are for example produced as described in document FR 3 073 669 A1.

Figure 20:
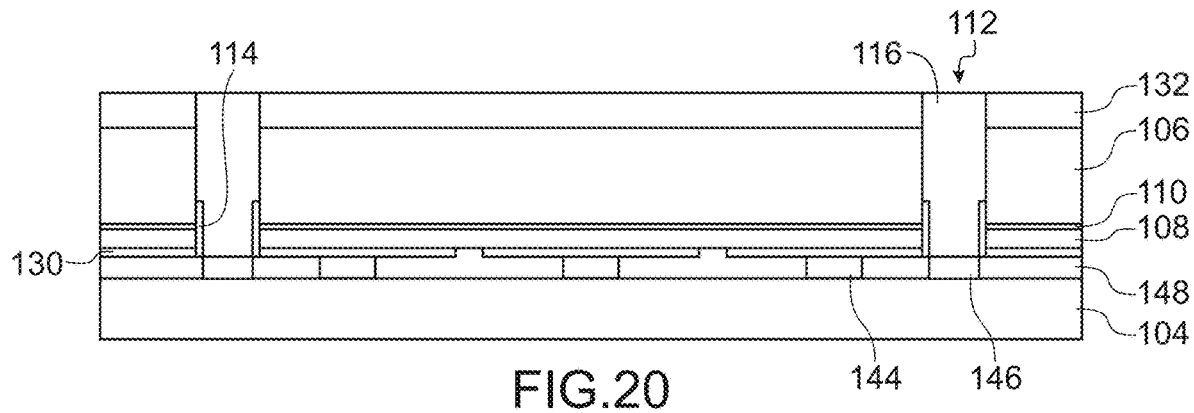

The first electrically conductive portions 116 are then produced in the remaining volume of the first trenches 112, by implementing steps similar to those described hereinabove for the first and second embodiments (see FIG. 20).

Figure 21:
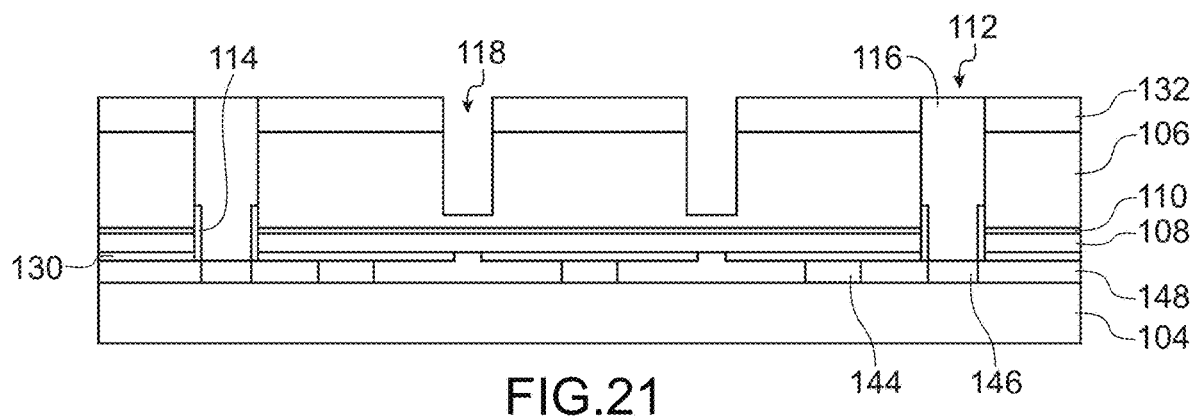

The pattern of the second trenches 118 is then etched in the hard mask 132, then through a part of the thickness of the first layer 106 (FIG. 21).

Figure 22:
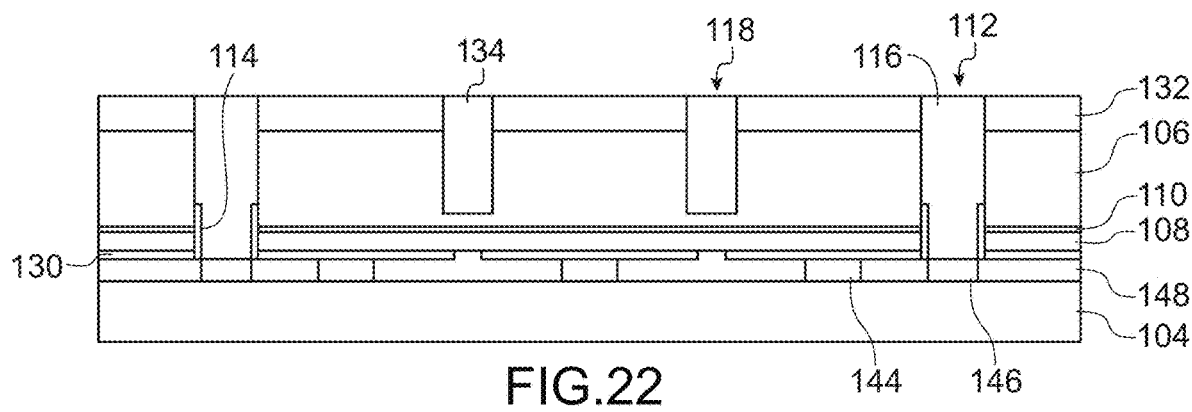

The device 100 is then completed by filling the second trenches 118 with at least one electrically conductive material forming the second electrically conductive portions 134 (see FIG. 22).

Figure 23:
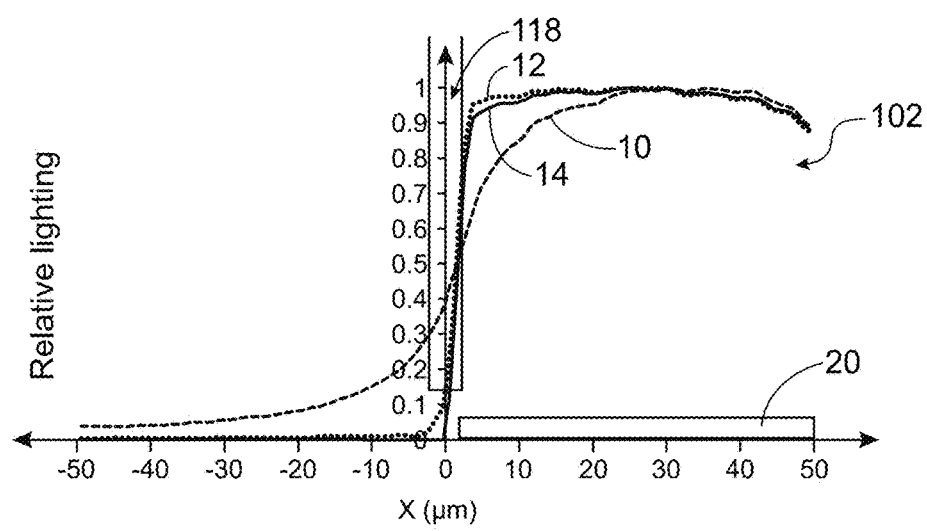
FIG. 23 shows lighting simulations obtained in a pixel defined by second trenches within a device.

FIG. 23 shows lighting simulations carried out in a pixel of GaN defined by second trenches similar to those carried out within the device 100. This simulation is obtained with a pixel formed in a stack of GaN of a height equal to 7 µm, with these trenches that do not pass through a portion of the GaN of thickness equal to 200 nm. The light emission is produced in the part of the thickness that is not passed through by the second trenches 118, which bears reference 20 in FIG. 23. The width of the second trench 118 shown in FIG. 23 is equal to 3 µm. In this figure, the curve 10 represents the relative lighting obtained in the absence of the second trench 118, the curve 12 represents the relative lighting obtained in the presence of the second trench 118 when the latter is not filled with an electrically conductive material and here filled with air, and the curve 14 represents the relative lighting obtained in the presence of the second trench 118 when the latter is filled with aluminium forming a second electrically conductive portion 134. The curves show that even in the absence of a second electrically conductive portion 134, the second trenches 118 filled with air carry out good optical insulation between adjacent pixels, this optical insulation being further improved in the presence of second electrically conductive portions 134 which reduce the cross-talk between adjacent pixels.

A method for producing the device 100 according to a fourth embodiment is described herein below in relation with FIGS. 24 to 27.

As in the second embodiment described hereinabove in relation with FIGS. 13 to 15, the first trenches 112 are etched, with the transfer on the support 104, partially through the entire thickness of the layer 130, of the second layer 108 (and of the emissive layer or layers 110 if such layers are present in the stack) and through only a portion (thickness $e_1$) of the thickness of the first layer 106.

Figure 24:
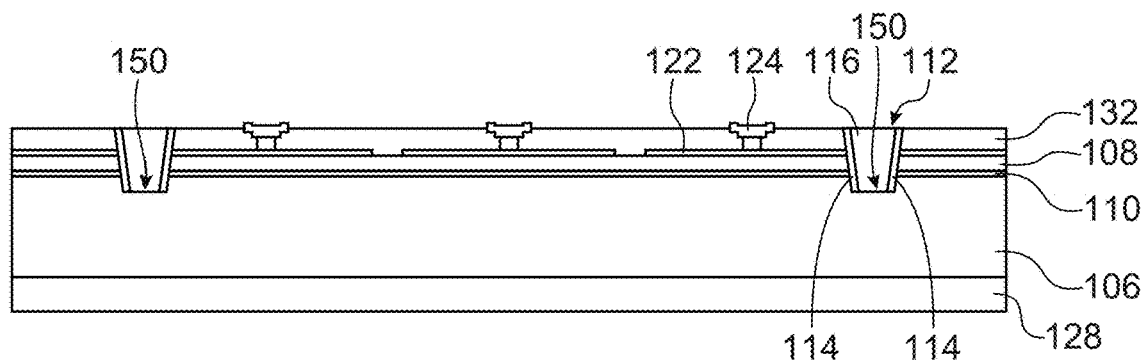
FIGS. 24 to 27 show the steps of a method for producing a photo-emitting and/or photo-receiving diode device according to a fourth embodiment.

The dielectric portions 114 and the first electrically conductive portions 116 are then produced in the first trenches 112 that do not pass through the entire thickness of the first layer 106 (see FIG. 24). At this stage of the method, the first electrically conductive portions 116 are completed and are in electrical contact with the material of the first layer 106 at the bottom walls 150 of the first trenches 112.

Figure 25:
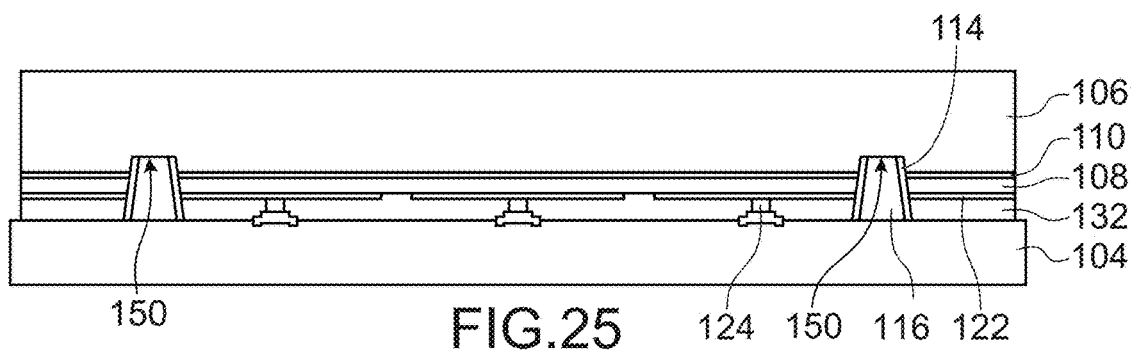

The unit is then transferred on the support 104, as in the second embodiment (see FIG. 25).

Figure 26:
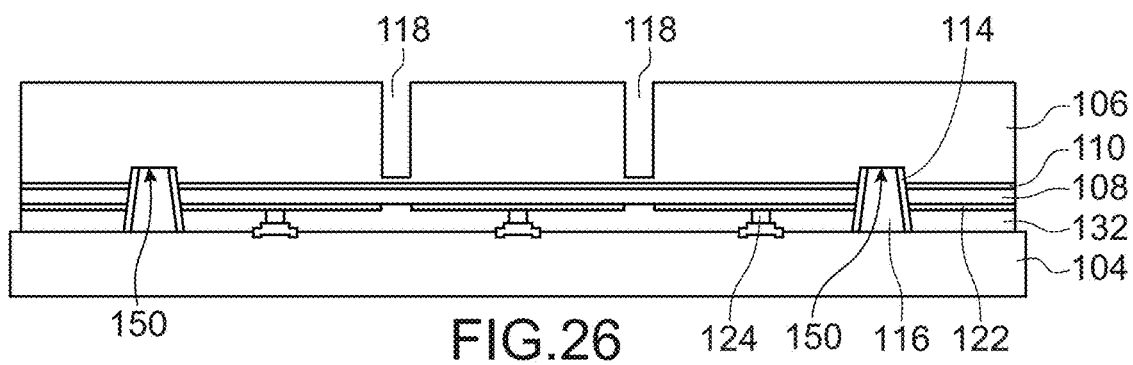

An etching is then implemented to etch the second trenches 118 (see FIG. 26).

Figure 27:
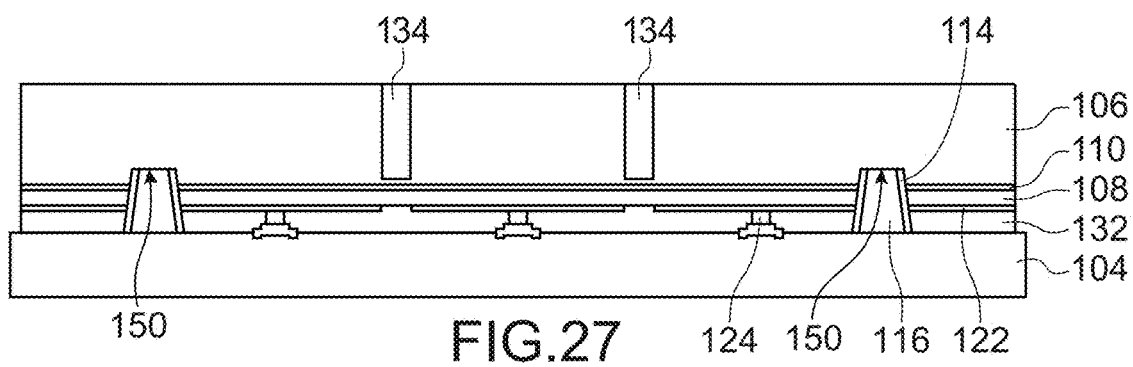

The second trenches 118 are then filled with one or more electrically conductive materials, forming the second electrically conductive portions 134 (see FIG. 27).

In this fourth embodiment, it is also possible to carry out a thinning of the first layer 106 after the removing of the substrate 128.

In the particular examples and embodiments described hereinabove, the device 100 comprises a diode array 102 which are light-emitting diodes, the microelectronic device may be part of a LED display device (screens, projector, video wall, etc.). This diode array 102 comprises the first electrically conductive portions 116 which form a cathode that is common to all the diodes 102, and each diode 102 comprises a second electrically conductive portion 122 forming an anode that makes it possible to carry out the individual addressing of each one of the diodes 102.

Alternatively, the microelectronic device 100 may comprise a diode array 102 which are of the photo-receiving diodes, or photodiodes. In this alternative, the anodes and the cathodes of the diodes 102 are not used to provide current to the diodes 102 but to recover the currents photo-generated by the diodes 102.

According to another alternative, whether the diodes 102 correspond to photo-emitting or photo-receiving diodes, the diodes 102 may not comprise intrinsic semiconductor layers 110 between the first and second layers 106, 108. In this case, the p- and n-doped semiconductors are then disposed directly against one another.

In all the examples and embodiments of the invention, it is possible to dispose optical elements on the diodes 102, for example phosphors that modify the wavelength emitted by the diodes 102.

The invention claimed is:

1. A photo-emitting and/or photo-receiving diode array device comprising at least:
    a stack of at least one first semiconductor layer and at least one second semiconductor layer doped according to different types of conductivity, each one of the diodes comprising a portion of said at least one first semiconductor layer superimposed on a portion of said at least one second semiconductor layer;
    first trenches passing through the entire thickness of said at least one second semiconductor layer and at least one part of the thickness of said at least one first semiconductor layer and surrounding at least one region of the stack wherein several diodes are formed;
    dielectric portions arranged in the first trenches and covering the lateral flanks of said region of the stack over the entire thickness of said second semiconductor layer and a first part of the thickness of said first semiconductor layer;
    first electrically conductive portions arranged in the first trenches, covering the lateral flanks of said region of the stack over a second part of the thickness of said at least one first semiconductor layer not covered by the dielectric portions and/or covering bottom walls of the first trenches, and forming at least one part of the first electrodes of the diodes formed in said region of the stack;
    at least one second trench partially passing through the thickness of said at least one first semiconductor layer from a first face of said at least one first semiconductor layer opposite a second face of said at least one first semiconductor layer facing said at least one second semiconductor layer, and separating the portions of said at least one first semiconductor layer from the diodes formed in said region of the stack without passing through the interface between said at least one first semiconductor layer and at least one second semiconductor layer;
    several second electrodes electrically insulated from one another and each one electrically connected to one of the portions of said at least one second semiconductor layer of the diodes formed in said region of the stack;
    and wherein the portions of said at least one second semiconductor layer of the diodes formed in said region of the stack form a continuous semiconductor portion which is not crossed by the first trenches and said at least one second trench.

2. The device according to claim 1, further comprising at least one second electrically conductive portion arranged in said at least one second trench.

3. The device according to claim 2, wherein said at least one second electrically conductive portion is electrically coupled to the first electrically conductive portions and forms, with the first electrically conductive portions, the first electrodes of the diodes.

4. The device according to claim 3, wherein:
    all the diodes of the array are formed in said region of the stack, and
    each one of the diodes of the array is separated from one or more adjacent diodes by at least one of several second trenches.

5. The device according to claim 1, wherein:
    the first trenches surround several regions of the stack wherein the diodes of the array are formed, and
    one or more of these regions each comprise the second trench or several second trenches.

6. The device according to claim 5, wherein the region or regions of the stack comprising the second trench or trenches form a central part of the diode array.

7. The device according to claim 1, further comprising an electronic control circuit whereon the stack of said at least one first semiconductor layer and at least one second semiconductor layer is arranged and to which the first and second electrodes of the diodes are electrically coupled.

8. The device according to claim 1, wherein:
the diodes correspond to photodiodes, the stack further comprising at least one intrinsic semiconductor layer arranged between said at least one first semiconductor layer and said at least one second semiconductor layer and such that lateral flanks of said at least one intrinsic semiconductor layer present in the first trenches are covered by the dielectric portions, said at least one second trench not passing through said at least one intrinsic semiconductor layer, or
the diodes correspond to LEDs, the stack comprising at least one quantum well emissive layer arranged between said at least one first semiconductor layer and said at least one second semiconductor layer and such that lateral flanks of said at least one quantum well emissive layer present in the first trenches are covered by the dielectric portions, said at least one second trench not passing through said at least one quantum well emissive layer.

9. A method for producing a photo-emitting and/or photo-receiving diode array device, comprising at least:
producing a stack of at least one first semiconductor layer and at least one second semiconductor layer doped according to different types of conductivity, each one of the diodes being intended to comprise a portion of said at least one first semiconductor layer superimposed on a portion of said at least one second semiconductor layer;
producing several second electrodes electrically insulated from one another and each one electrically connected to one of the portions of said at least one second semiconductor layer of the diodes intended to be formed in said region of the stack;
producing first trenches passing through the entire thickness of said at least one second semiconductor layer and at least one part of the thickness of said at least one first semiconductor layer and surrounding at least one region of the stack wherein several diodes are intended to be formed;
producing dielectric portions arranged in the first trenches and covering the lateral flanks of said region of the stack over the entire thickness of said at least one second semiconductor layer and a first part of the thickness of said at least one first semiconductor layer;
producing first electrically conductive portions arranged in the first trenches, covering the lateral flanks of said region of the stack over a second part of the thickness of said at least one first semiconductor layer not covered by the dielectric portions and/or covering bottom walls of the first trenches, and forming at least one part of the first electrodes of the diodes intended to be formed in said region of the stack;
producing at least one second trench partially passing through the thickness of said at least one first semiconductor layer from a first face of said at least one first semiconductor layer opposite to a second face of said at least one first semiconductor layer facing said at least one second semiconductor layer, and separating the portions of said at least one first semiconductor layer from the diodes formed in said region of the stack without passing through the interface between said at least one first semiconductor layer and said at least one second semiconductor layer;
and wherein the portions of said at least one second semiconductor layer of the diodes produced in said region of the stack form a continuous semiconductor portion which is not crossed by the first trenches and said at least one second trench.

10. The method according to claim 9, wherein the stack is produced by epitaxy on a substrate such that said at least one first semiconductor layer is arranged between the substrate and said at least one second semiconductor layer.

11. The method according to claim 10, wherein the first trenches, the dielectric portions and the first electrically conductive portions are produced by:
after producing the second electrodes, first etching of the stack through said at least one second semiconductor layer and the first part of the thickness of said at least one first semiconductor layer, according to a pattern defining the first trenches, forming first parts of the first trenches, then
producing dielectric portions covering the lateral flanks of the first parts of the first trenches, then
second etching of the stack through at least one part of a remaining thickness of said at least one first semiconductor layer and according to the pattern defining the first trenches, completing the producing of the first trenches, then
deposition of at least one electrically conductive material in the first trenches, forming the first electrically conductive portions.

12. The method according to claim 10, further comprising, after producing the first electrically conductive portions and before producing said at least one second trench:
making the stack integral with a support such as the stack is arranged between the substrate and the support, then
removing the substrate.

13. The method according to claim 10, wherein the first trenches, the dielectric portions, the first electrically conductive portions and said at least one second trench are produced by:
after producing the second electrodes, first etching of the stack through said at least one second semiconductor layer and a part of the thickness of said at least one first semiconductor layer, according to a pattern defining the first trenches, forming first parts of the first trenches, then
producing dielectric portions covering the lateral flanks of the first parts of the first trenches, then
deposition of at least one electrically conductive material in the first parts of the first trenches, forming first parts of the first electrically conductive portions, then
making the stack integral with a support such as the stack is arranged between the substrate and the support, then
removing the substrate, exposing the first face of said at least one first semiconductor layer, then
second etching of the stack through the first face of said at least one first semiconductor layer and according to a pattern defining the first trenches and said at least one second trench, with stopping on the first parts of the first electrically conductive portions, forming second parts of the first trenches and said at least one second trench, then
deposition of the electrically conductive material in the second parts of the first trenches and in said at least one second trench, completing the production of the first electrically conductive portions and of at least one second electrically conductive portion arranged in said at least one second trench.

14. The method according to claim 10, wherein the first trenches, the dielectric portions, the first electrically conductive portions and said at least one second trench are produced by:
- after producing the second electrodes, making the stack integral with a support such as the stack is arranged between the substrate and the support, then
- removing the substrate, exposing the first face of said at least one first semiconductor layer, then
- first etching of the stack through said at least one first semiconductor layer and said at least one second semiconductor layer, according to a pattern defining the first trenches, forming the first trenches, then
- producing dielectric portions covering the lateral flanks of the first parts of the first trenches, then
- deposition of at least one electrically conductive material in the first trenches, forming the first electrically conductive portions, then
- second etching of the stack through a part of the thickness of said at least one first semiconductor layer and according to a pattern defining the second trench, forming said at least one second trench.

15. The method according to claim 10, wherein the first trenches, the dielectric portions, the first electrically conductive portions and said at least one second trench are produced by:
- after producing the second electrodes, first etching of the stack through said at least one second semiconductor layer and the first part of the thickness of said at least one first semiconductor layer according to a pattern defining the first trenches, forming the first trenches, then
- producing dielectric portions covering the lateral flanks of the first trenches, then
- deposition of at least one electrically conductive material in the first trenches, forming the first electrically conductive portions that cover the bottom walls f the first trenches, then
- making the stack integral with a support such as the stack is arranged between the substrate and the support, then
- removing the substrate, exposing the first face of said at least one first semiconductor layer, then
- second etching of the stack through the first face of said at least one first semiconductor layer and according to a pattern defining said at least one second trench, forming said at least one second trench.

* * * * *